United States Patent [19]

Eguchi et al.

[11] Patent Number: 6,097,100
[45] Date of Patent: Aug. 1, 2000

[54] RESIN SEALED SEMICONDUCTOR DEVICES AND A PROCESS FOR MANUFACTURING THE SAME

[75] Inventors: Shuji Eguchi, Toukai-mura; Yasuhide Sugawara, Hitachi; Toshiaki Ishii, Hitachi; Hiroyoshi Kokaku, Hitachi; Akira Nagai, Hitachi; Ryou Moteki, Hitachi; Ogino Masahiko, Hitachi; Masanori Segawa, Hitachi; Rie Hattori, Hitachinaka; Nobutake Tsuyuno, Hitachi; Takumi Ueno, Mito; Atsushi Nakamura, Fuchu; Asao Nishimura, Kokubunji, all of Japan

[73] Assignee: Hitachi, Ltd., Tokyo, Japan

[21] Appl. No.: 08/915,334

[22] Filed: Aug. 20, 1997

[30] Foreign Application Priority Data

Aug. 22, 1996 [JP] Japan ................................ 8-220991

[51] Int. Cl.[7] .................................................. H01L 23/28
[52] U.S. Cl. ............................ 257/787; 257/788; 257/789
[58] Field of Search ..................................... 257/788, 778, 257/738, 787, 789, 796

[56] References Cited

U.S. PATENT DOCUMENTS 5,726,391  3/1998  Iyer et al. ................................ 257/788
5,880,179  3/1999  Ito et al. .................................. 523/433

*Primary Examiner*—Carl Whitehead, Jr.
*Assistant Examiner*—Roy Potter
*Attorney, Agent, or Firm*—Antonelli, Terry, Stout & Kraus, LLP

[57] ABSTRACT

A resin encapsulated semiconductor element is encapsulated with resin composition containing an organic compound selected from the group consisting of organobromine compounds, organophosphorus compounds and organonitrogen compounds, an inorganic filler, and a metal borate. The obtained resin encapsulated semiconductor element has the same flame resistance as a conventional semiconductor element which is encapsulated with a resin composition containing a halogen and antimony compound, and furthermore, has remarkably improved reliabilities regarding moisture resistance and storing at a high temperature by effects of the contained metal borate for suppressing generation of or trapping released gas components, such as halogen or phosphorus, and others.

16 Claims, 4 Drawing Sheets

RESIN SEALED SEMICONDUCTOR DEVICES AND A PROCESS FOR MANUFACTURING THE SAME

BACKGROUND OF THE INVENTION

The present invention relates to resin encapsulated semiconductor elements, which can be improved significantly to increase their reliability when at a high temperature, and to enhance their humidity resistance by encapsulating the semiconductor element with a thermosetting resin composition containing at least an organic compound selected from the group consisting of organobromine compounds, organophosphorus compounds and organonitrogen compounds, and metal borates, and to a process for manufacturing the same.

The semiconductor elements, such as a transistor, IC, LSI, and the like, are mainly encapsulated with a resin using a plastic package to facilitate mass production. As a semiconductor encapsulating material, a resin composition containing an epoxy resin and a phenol resin hardener is most commonly used, because the resin composition is superior in providing a preferable reliability and provides desirable balance among moldability, moisture absorbing resistance and adhesion.

In order to add flame resistance to the properties of the semiconductor encapsulating material, a brominated organic compound, such as a brominated epoxy resin or brominated phenol resin, and an antimonic compound serving as a flame resisting assistant agent are mixed into the encapsulating material.

It has been well known hitherto that the brominated organic compound and the antimonic compound contained in the encapsulating material exert an undesirable influence on the reliability of the semiconductor elements. A junction between the aluminum wiring pad and a gold wire in a semiconductor element has exhibited the problem that breakage of the wire is caused by corrosion, which is enhanced by the release of bromine from the organobromine compound at a high temperature. Particularly, the problem is significant in semiconductor elements in electronic apparatus of the type used in an automobile engine room or in an environment at a high temperature. Furthermore, the released bromine itself enhances corrosion of the aluminum wiring in the semiconductor element, although it may be not so significant as chlorine, and this can be a reason for the decrease in the moisture resistance of the semiconductor element. The above-mentioned problems are caused not only by the organobromine compound, but also by the antimonic compound of the flame resisting assistant agent.

Because the antimonic compound generates antimony bromide gas, it operates to enhance the release of bromine. For this reason, a semiconductor encapsulating material, which can satisfy both satisfactory flame resistance and reliability of the semiconductor elements has been strongly required.

In order to increase the reliability of the semiconductor elements, the suppressing of the release of bromine under conditions of high humidity and high temperature, the trapping the released bromine, and the adopting of a method for making the device flame resistance using with non-halogen group compounds have been proposed.

As a method for suppressing the release of bromine, a brominated epoxy resin having a high thermal stability was proposed, and an encapsulating material containing brominated bisphenol A type epoxy resin, wherein bromine was arranged at a metha position, was disclosed in JP-A-5-320319 (1993). An inorganic ion exchanger of an inorganic hydrotalcite group disclosed in JP-A-4-48759 (1992) and JP-A-6-53789 (1994) has been mixed in the encapsulating material. As method of making the device flame resistant using non-halogen group compounds, solely mixing a flame retardant the red phosphorus group has been disclosed in JP-A-7-157542 (1995) and JP-A-7-173372 (1995), and solely mixing a boron compound has been disclosed in JP-A-6-107914 (1994).

Furthermore, a concurrent use of at least two kinds of non-halogen group flame retardants selected from the group consisting of phenol resin, phosphorus or red phosphorus, nitrogen, boron compounds and metal hydrides has been disclosed in JP-A-7-331033 (1995) and JP-A-8-151505 (1996).

SUMMARY OF THE INVENTION

Although the prior art proposals mentioned above have exhibited advantages with respect to improving the reliability of semiconductor elements, various problems still remain to be solved. The thermal decomposition temperature of the brominated epoxy resin having a high thermal stability can be elevated when the resin exists alone. However, if the resin is mixed with other encapsulating materials, its characteristics are hidden behind the other materials, and a beneficial elevation of the thermal decomposition temperature can scarcely be expected. Therefore, the possibility of improving the reliability in this way is truely evident. Mixing the ion exchanger has a limit the capability for trapping the released bromine in various aspects. Increasing the amount of the ion exchanger causes decreasing the reliability, in spite of the expectation of improving the trapping effect for the released bromine.

Furthermore, the ion exchanger causes a decreasing moldability of the encapsulating materials and a significant increase in the moisture absorption. In order to satisfy a standard for flame resistance, the amount of the non-halogen group flame retardants must be increased significantly more than that of the conventional bromine/antimony group flame retardants. The large amount of added flame retardant causes a decreasing moldability and adhesion of the encapsulating material, as well as an increase in the moisture absorption. The result is adverse to an improvement in the reliability of the semiconductor elements.

Furthermore, even in a case of a resin composition containing a concurrent use of at least two kinds of non-halogen group flame retardants, the amount of the non-halogen group flame retardants employed must be increased more than that of the conventional flame retardant. Therefore, realizing desirable characteristics of a resin composition, necessary for use in a semiconductor element, such as low thermal expansion, low moisture absorption and high adhesion, is difficult. Accordingly, the uses of the resin composition are restricted at the present time to laminated materials and insulators for various electric members, or the resin composition is restricted to silicone resin.

In a case when red phosphorus is used as the flame retardant, the mixing amount can be decreased less than other flame retardant. However, a possibility of igniting the material in a mixing process, and moisture absorption of the encapsulating material are increased. Therefore, coating of the red phosphorus with an inorganic material has been proposed, but the problem is not completely solved.

Although several methods for improving the reliability of the semiconductor elements in storage for a long time at a high temperature and the resistance against moisture absorption were disclosed, significant advantages could not still be obtained.

The present invention has been achieved in view of the above circumstances, and is aimed at providing resin encapsulated semiconductor elements having superior reliability in characteristics under various conditions such as storage characteristics at a high temperature, moisture absorption resistance, and others with maintaining the moldability and the flame resistance as well as conventional ones, and a process for manufacturing the same.

In order to realize the above objects, the inventors had achieved the present invention with finding that the various reliability of the semiconductor elements could be improved significantly by concurrently using at least an organic compound selected from the group consisting of organobromine compounds, organophosphorus compounds, and organonitrogen compounds, and metal borates as the flame retardant. Feature of the present invention is in a concurrent use of the organic compound flame retardant and the boron compound in order to compensate each other the defects owned by the organic compound flame retardant solely and the defects owned by the metal borate solely. Although the sole organic flame retardant composed of at least an organic compound selected from the group consisting of organobromine compounds, organophosphorus compounds, and organonitrogen compounds can provide flame resistance, influence of released low molecular components such as bromine and phosphorus, which enhances corrosion at connecting portion of aluminum wiring pads connected with aluminum wiring or gold wire in a condition at a high temperature and a high humidity, becomes remarkable.

A large amount of the metal borate is required to give flame resistance if it is used solely, and significant decrease in the moldability and the moisture absorption characteristics of the encapsulating material can not be avoided. In accordance with the present invention, the metal borate was found to have a novel feature that the metal borate had a high potential for trapping the low molecular components released from the encapsulating material, in addition to the conventional advantages such as being less harmful and giving flame resistance.

Therefore, the metal borate can perform roles not only as a flame retardant but also suppressing thermal decomposition of the encapsulating material.

That is, the resin encapsulated semiconductor element of the present invention is a resin encapsulated semiconductor element characterized in encapsulating semiconductor elements with a thermosetting resin composition containing an inorganic filler, an organic compound composed of at least an organic compound selected from the group consisting of organobromine compounds, organophosphorus compounds, and organonitrogen compounds, and metal borates. The organic compound is dissolved into the thermosetting resin homogeneously, and the metal borate is dispersed into the thermosetting resin composition homogeneously as particles. The cured body of the thermosetting resin composition for encapsulating the semiconductor element of the present invention has such characteristics that a linear expansion coefficient in the range of $0.6\sim2.5\times10^{-5}$, a glass transition temperature of at least 110° C., a saturated moisture absorption of utmost 0.8 wt. % in a condition of 85° C., 85% RH, and level V-0 in the flame resistance standard UL-94.

Furthermore, in accordance with the present invention, an epoxy resin composition is particularly preferable among the above thermosetting resin composition in view of its characteristics, reliability, and ease-in use. The epoxy resin is desirably consisting of at least (A) epoxy resin, (B) a phenol resin hardener, (C) a curing accelerator, (D) an organic compound composed of at least an organic compound selected from the group consisting of organobromine compounds, organophosphorus compounds, and organonitrogen compounds, (E) metal borate, and (F) inorganic filler.

The organic flame retardant used in the present invention is selected from the group consisting of organobromine compounds, organophosphorus compounds, and organonitrogen compounds, and these compounds can be used solely or at least two kinds of the compounds concurrently.

As the organobromine compounds, brominated epoxy resin such as brominated bisphenol A type epoxy resin, brominated novolak phenol type epoxy resin, and the like, and a phenol resin hardener such as brominated novolak type phenol resin, and the like, are preferable in view of heat resistance and safety.

As the organophosphorus compounds, a compound having aromatic rings and the structure indicated by the following chemical formula (1) is preferable:

(1)

For example, at least one of triphenylphosphine oxide, phosphoric acid ester, epoxy resin containing phosphorus, phosphorus compound containing phenolic hydroxide, and phosphazene, can be used.

As the organonitrogen compound, a compound having a heterocyclic ring containing nitrogen atom, or an aromatic ring such as benzene ring containing nitrogen atom is desirable in view of thermal stability and flame resistance, and at least one of melamine resin, epoxy resin containing a nitrogen atom and a benzene ring, thermosetting polyimide resin, and the like, can be used. Among the above compounds, thermosetting polyimide resin is superior in heat resistance, and, if it is mixed with epoxy resin composition, an advantage as a component to give heat resistance can be expected. One of the feature of the present invention is dissolving the above mentioned flame retardants into epoxy resin completely to mix homogeneously to a molecular level, in order to decrease the mixing amount of the flame retardant as small as possible. In accordance with the present invention, brominated epoxy resin and brominated phenol resin are particularly preferable among the above organobromine compounds, organophosphorus compounds, and organonitrogen compounds, in view of the moldability and the reliability based on experiences in practical use for a long time as conventional encapsulating materials for semiconductor. However, even with the organophosphorus compounds or the organonitrogen compounds, a composition superior in curability at molding operation and thermal stability satisfying sufficiently the characteristics as a flame retardant can be obtained by using epoxy resin containing phosphorus or nitrogen, or melamine resin, having a functional group reactive with the epoxy resin of the present invention.

The organic compound composed of at least an organic compound selected from the group consisting of organobromine compounds, organophosphorus compounds, and organonitrogen compounds, used in the present invention is mixed with resin composition so that the element content of at least one of bromine, phosphorus, and nitrogen in the organic compound becomes in the range of 0.35~10% by weight, more desirably 0.4~7% by weight, to the total amount of the resin except the metal borate and inorganic filler. The organic compound gives flame resistance to the resin by dispersing homogeneously in the resin. The flame resistance of the resin composition is decided by the content of at least one of bromine, phosphorus, and nitrogen in the resin. Therefore, one of the feature of the present invention is in designating appropriate content of each of the above elements in the total amount of the resin except the metal borate and the inorganic filler. If the element content of at least one of bromine, phosphorus, and nitrogen to the total amount of the resin except the metal borate and the inorganic filler is less than 0.35% by weight when using the organic compound, the level V-O of the flame resistance standard of UL-94 can not be achieved. If the mixing amount of the organic compound is more than 10% by weight to the total amount of the resin composition, the effect for suppressing the generation of low molecular weight components in a condition at a high temperature and a high humidity is decreased to be insufficient, and even if the boron compound is used concurrently, and improvement of the characteristics becomes difficult. All the above phenomena cause decreasing the reliability of the semiconductor elements.

In accordance with the present invention, any boron compound can be used concurrently with the organic compound if the boron compound may release crystalline water at least 180° C., or may release water by thermal decomposition. For instance, borax, or a metallic salt of boric acid such as zinc borate, aluminum borate, magnesium borate, and the like, can be used. Among the above boron compounds, zinc borate is particularly preferable, because its temperature for releasing crystalline water is at least 200° C., and it has a function for trapping the low molecular weight gases. If the temperature for releasing crystalline water is higher than 200° C., generation of voids at a temperature for molding the encapsulating material (160° C.~200° C.) can be prevented. These boron compounds can be used solely or concurrently at least two kinds of the boron compounds having different temperature for releasing crystalline water each from other. The particle size of the boron compound is desirably utmost 20 micron ($\mu$m) in average particle diameter, and utmost 100 micron in the maximum particle diameter. However, particularly utmost 10 micron ($\mu$m) in the average particle diameter, and utmost 50 micron in the maximum particle diameter are preferable. Here, the average particle diameter means a particle diameter at 50% by accumulated weight.

The mixing amount of the metal borate of the present invention can be decided responding to the element content of at least one of bromine, phosphorus, and nitrogen contained in the organic compound composed of at least an organic compound selected from the group consisting of organobromine compounds, organophosphorus compounds, and organonitrogen compounds, in consideration of a balance of all the characteristics such as moldability reliability, and flame resistance of the encapsulating material. The mixing amount of the metal borate is desirably in the range of 1.5~15% by weight to the total amount of the resin composition including the inorganic filler. If the mixed amount of the metal borate is less than 1.5% by weight to the total amount of the resin composition, the reliability of the semiconductor elements is scarcely improved. Inversely, the reliability of the semiconductor elements is decreased, because a large amount of addition of the organic compound is required for giving the flame resistance. On the contrary, the mixed amount of the metal borate of more than 15% by weight to the total amount of the resin composition is not desirable, because decreasing the moldability and the adhesion of the encapsulating material, and increasing the moisture absorption become significant. The metal borate of the present invention is dispersed homogeneously as particles in the thermally cured body of the epoxy resin composition for encapsulating as same as the inorganic filler, in order to realize the effects for both the flame resistance and suppressing the generation of the low molecular weight components as large as possible.

In accordance with the present invention, the characteristics of extracted liquid from the epoxy resin composition including the organic compound composed of an organic compound selected from the group consisting of organobromine compounds, organophosphorus compounds, and organonitrogen compounds, and the metal borate, contribute remarkably to the improvement in moisture resistance of the semiconductor elements. Particularly, a suppressing effect for corrosion and pitting corrosion of aluminum wiring is significant. The above characteristics of the extracted liquid from the epoxy resin composition are an electric conductivity and pH of the liquid extracted from the epoxy resin composition by mixing the epoxy resin composition with purified water of 10 times volume, and storing the mixture at 120° C. for 40 hours. The electric conductivity is an index indicating purity of the epoxy resin composition, and it is required to be less than 150 $\mu$S/cm in the above extracting condition as same as the conventional material for encapsulating the semiconductor elements. The pH of the extracted liquid in accordance with the present invention is more neutral in comparison with the pH of the extracted liquid of the conventional epoxy resin encapsulating material, and typically in the range of 5.0~7.5. The pH in the above range has a more significant suppressing effect for corrosion and pitting corrosion of the aluminum pad and the aluminum wiring than conventional pH.

The epoxy resin composition for encapsulating semiconductor element of the present invention is composed of (A) epoxy resin, (B) phenol resin hardener, (C) curing accelerator, (D) an organic compound composed of at least one selected from the group consisting of organobromine compounds, organophosphorus compounds, and organonitrogen compounds, (E) metal borate, and (F) inorganic filler, which are indispensable in view of the moldability and the reliability. However, additionally plasticizers, coupling agents, and various additives such as mold release agents, coloring material, and others are contained.

The epoxy resin conventionally used for encapsulating material of the semiconductor also can be used in the present invention, for instance, phenol novolak type epoxy resin, cresol novolak type epoxy resin, bisphenol group epoxy resin such as bisphenol A, bisphenol F, bisphenol S type epoxy resin, polyfunctional epoxy resin such as at least trifunctional phenol or cresol base epoxy resin, and bifunctional or at least trifunctional epoxy resin having a biphenyl skeleton, a naphthalene skeleton, or a dicyclopentadiene skeleton, can be used solely or concurrently with at least two kinds of the epoxy resin.

The mixing amount of the phenol resin hardener in the resin composition for encapsulating the semiconductor of the present invention is desirably in the range of 0.5~1.5 equivalent to the epoxy resin. If the mixing amount of the hardener is less than 0.5 equivalent to the epoxy resin, the heat resistance, the moisture resistance, and the electric characteristics of the cured body are deteriorated, because the curing of the epoxy resin is not performed completely. If the mixing amount of the hardener is more than 1.5 equivalent to the epoxy resin, the electric characteristics and the moisture resistance of the cured body are deteriorated, because the hydroxide groups in the hardener remain a lot in the resin even after the resin is cured.

In accordance with the present invention, an inorganic filler is mixed into the resin composition used for resin encapsulated semiconductor elements. The inorganic filler is added aiming at improving the thermal expansion coefficient, thermal conductivity, and the like, of the cured body. Although various compounds can be used as the inorganic filler, it is important to use a filler having a thermochemical stability for electronic members. Practically, at least one of inorganic particles selected from the group consisting of fused silica, crystalline silica, alumina, aluminum nitride, and silicone nitride, is desirable. The average particle diameter of the filler is desirably in the range of 1~30 $\mu$m. When the average particle diameter is less than 1 $\mu$m, viscosity of the resin composition is increased, and fluidity is remarkably decreased. When the average particle diameter is more than 30 $\mu$m, the resin composition is apt to separate from the filler in a molding process, and homogeneousness of the cured body can not be maintained. Accordingly, the characteristics of the cured body is fluctuated, and filling the resin composition with the filler into a narrow space becomes difficult. Shape of the inorganic filler can be spherical and cubical, and these shapes can be used solely or concurrently.

In accordance with the present invention, a flexibilizer for giving toughness and low modulus of elasticity is usable as a component of the resin depending on necessity. The mixing amount of the flexibilizer is desirably in the range of 2~20% by weight to the total weight of the resin composition.

When the mixing amount of the flexibilizer is less than 2% by weight, the effect for giving toughness and low modulus of elasticity is scarce, and when it is more than 20% by weight, the fluidity of the resin composition is significantly decreased, and contamination of the molding die becomes remarkable on account of floating the flexibilizer on surface of the resin composition in the molding process. Butadiene-acrylonitrile group copolymer, the copolymer modified of its end terminal or side terminal amino group, epoxy group, or carboxyl group, butadiene group flexibilizer such as acrylonitrile-butadiene-styrene copolymer, and the like, silicone group flexibilizer modified of its end terminal or side terminal amino group, hydroxyl group, epoxy group, or carboxyl group, and the like, are usable as the flexibilizer, because a compound which is insoluble into the epoxy resin composition can make the cured body have a low modulus of elasticity without decreasing the glass transition temperature. In view of heat resistance, moisture resistance, and high purity, the silicone group flexibilizer is particularly desirable.

In accordance with the present invention, various additives such as coupling agents for enhancing the adhesion of the resin composition with the filler such as epoxysilane, aminosilane, and the like, dyes and pigments for coloring, mold release agents for improving release of the cured body from a die, and others, are usable depending on necessity in the resin composition for resin encapsulated semiconductor elements of the present invention as far as the additive does not impair the object of the present invention depending on necessity.

A general process for producing encapsulating material for semiconductor using the above mentioned raw materials comprises the steps of mixing the designated amount of the raw materials sufficiently, kneading the mixture with heat rolls or an extruder, and cooling and pulverizing the mixture. As a general process for encapsulating the semiconductor with the encapsulating material obtained by the process mentioned above, a low pressure transfer molding method is generally used. However, in some cases, injection molding, compression molding, casting, and others, are usable.

In order to satisfy targets of various reliabilities such as flame resistance and crack resistance during heat cycling test (at least 1000 cycles, with a condition of one cycle is −55° C.⇔150° C.), moisture resistance (at least 100 hours in 65° C./95% RH), reflow soldering resistance (no crack with storing in 85° C./85% RH /at least 48 hours), storing at a high temperature (durable with storing at 175° C. for at least 2000 hours, particularly no defect in conductivity with storing at 200° C. for at least 1000 hours), and the like, of the semiconductor element encapsulated with the epoxy resin composition composed at least an organic compound selected from the group consisting of organobromine compounds, organo-phosphorus compounds, and organonitrogen compounds, and metal borate of the present invention, the cured body of the resin composition has characteristics of a linear expansion coefficient in the range of 0.6~2.5×10$^{-5}$, a glass transition temperature of at least 110° C., saturated moisture absorption of utmost 0.8% by weight in a condition of 85° C./85% RH, and flame resistance of level V-0 in UL-94 standard.

The semiconductor element of the present invention is superior in characteristics of storing at a high temperature, because the metal borate is contained in the encapsulating material. Therefore, the semiconductor element has a feature that a fraction of failure, a breakage of electrical conductivity at external terminals such as leads or soldering balls caused by corrosion at a connecting portion of aluminum pad/gold wire, is less than 0.1% when the semiconductor element is stored in air at 200° C. for 1000 hours with applying such a low voltage as 1 volt. With this condition, not only a conventional high operating temperature of 150° C. can be naturally guaranteed, but also 175° C. corresponding to automobile use can be guaranteed.

A process for manufacturing various resin encapsulated semiconductor elements obtained by encapsulating with the epoxy resin composition containing the organic compound and the metal borate of the present invention is explained, hereinafter.

The steps based on the first process of the present invention are indicated in FIG. 1. The first process comprises the steps of (a) mounting semiconductor elements onto die pads of a lead frame by heat-curing an organic adhesive agent such as an epoxy adhesive agent containing Ag, an adhesive film and the like, or soldering using lead/tin solder, (b) connecting the semiconductor elements with inner leads by gold wire, and (c) inserting the mounted semiconductor into a die and encapsulating it with the epoxy resin composition composed at least an organic compound selected from the group consisting of organobromine compounds, organo-phosphorus compounds, and organonitrogen compounds, and a metal borate, by pressurizing molding at 175° C. for 90 seconds using a transfer injector.

After the encapsulating, a post-curing step of heating at 175° C. is continued for 5 hours, and, (d) the steps of burring, exterior finishing, and trimming and forming of the lead frame are performed. The resin encapsulated semiconductor element can be obtained through the above steps of (a)~(d).

The steps based on the second process of the present invention are for obtaining the resin encapsulated semiconductor element of lead-on-chip mode as indicated in FIG. 2. The second process comprises the steps of (a) adhering semiconductor elements with a lead frame, whereon an organic film adhesive agent is previously attached, by heating, melting, and curing, (b) connecting electrodes of the semiconductor elements with inner leads by gold wire, and (c) inserting the adhered semiconductor into a die and encapsulating it with the epoxy resin composition composed at least an organic compound selected from the group consisting of organobromine compounds, organophosphorus compounds, and organonitrogen compounds, and a metal borate, by pressurizing molding at 175° C. for 90 seconds using a transfer injector, and a subsequent step to post-cure at 175° C. for 5 hours.

After the post-curing, the resin encapsulated semiconductor element can be obtained by the same steps (d) as the first process explained previously referring to FIG. 1.

The steps based on the third process of the present invention are for obtaining the resin encapsulated semiconductor element of ball grid array as indicated in FIG. 3. The third process comprises the steps of (a) forming a plane for mounting semiconductor elements on one side of a single layer or a multilayers printed circuit substrate, and a plane for mounting external terminals such as solder ball grid array on the reverse side of the printed circuit substrate, (b) mounting semiconductor elements by adhering non-active plane of the semiconductor elements onto the resin substrate having the printed circuit pattern with an epoxy resin adhesive agent, (c) electrically connecting electrodes on active plane of the semiconductor element with the circuit pattern on the resin substrate by wire bonding, (d) encapsulating the semiconductor elements by pressurizing molding with the epoxy resin composition composed at least an organic compound selected from the group consisting of organobromine compounds, organo-phosphorus compounds, and organonitrogen compounds, and a metal borate, at 175° C. for 90 seconds using a transfer injector, and subsequent curing at 175° C. for 5 hours, and (e) mounting the external terminals on the bottom of the resin substrate.

The steps based on the fourth process of the present invention are for obtaining the resin encapsulated semiconductor element of chip size as indicated in FIG. 4. The fourth process comprises the steps of (a) mounting semiconductor elements by adhering non-active plane of the semiconductor elements onto polyimide circuit tape with an insulating adhesive agent or film having a low modulus of elasticity, (b) electrically connecting electrodes on active plane of the semiconductor element with the circuit pattern on the polyimide circuit tape by wire bonding, (c) encapsulating the semiconductor elements by pressurizing molding with the epoxy resin composition composed at least an organic compound selected from the group consisting of organobromine compounds, organo-phosphorus compounds, and organonitrogen compounds, and metal borate, at 175° C. for 90 seconds using a transfer injector, and subsequent curing at 175° C. for 5 hours, and (d) mounting external terminals such as solder ball, and the like, on the bottom of the polyimide circuit tape.

In accordance with the resin encapsulated semiconductor element of the present invention, the semiconductor elements are encapsulated with the encapsulating material which contains concurrently the epoxy resin composition composed at least an organic compound selected from the group consisting of organobromine compounds, organo-phosphorus compounds, and organonitrogen compounds, and a metal borate. Therefore, flame resistance can be maintained without decreasing the characteristics of the encapsulating material such as moldability, adhesion, moisture absorption, and others. Moreover, various reliability such as moisture resistance, characteristics of storing at a high temperature, and others, can be improved, because the low molecular weight gas components and ionic components, which influence to the reliability, can be decreased or trapped. It means that the metal borate operates effectively not only as a flame retardant, but also as an agent for decreasing or trapping the generated low molecular weight gas components and ionic components.

The resin encapsulated semiconductor element encapsulated with the epoxy resin composition of the present invention contains a metal borate as a flame retardant instead of an antimony compound. Therefore, the resin encapsulated semiconductor element of the present invention has features such that it has a desirable anti-smoking property and no problem in generating poisonous gas on fire, and it is superior in ease-of use and safety in addition to the improvement in the reliability as a semiconductor element.

BRIEF DESCRIPTION OF THE DRAWINGS

These and other objects, features and advantages of the present invention will be understood more clearly from the following detailed description with reference to the accompanying drawings, wherein.

DETAILED DESCRIPTION OF THE PREFERRED EMBODIMENTS

Figure 1:
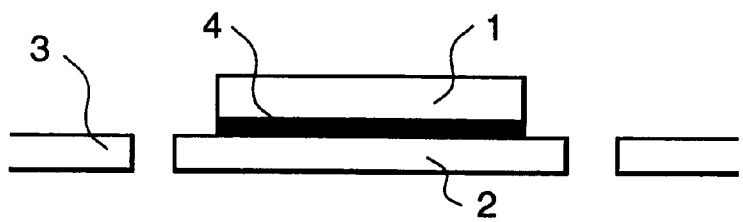
FIGS. 1(a)~1(d) are schematic cross sections indicating the process for manufacturing the resin encapsulated semiconductor element of the present invention, wherein the semiconductor elements mounted on the die pads on the lead frame are encapsulated with the resin composition containing an organic flame retardant and a borate compound.
Figure 1:
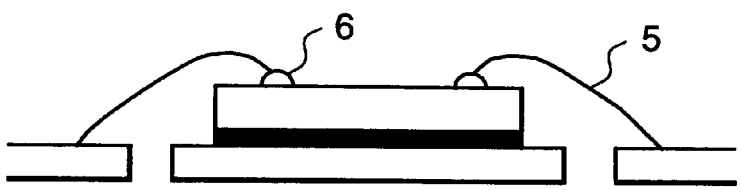
Figure 1:
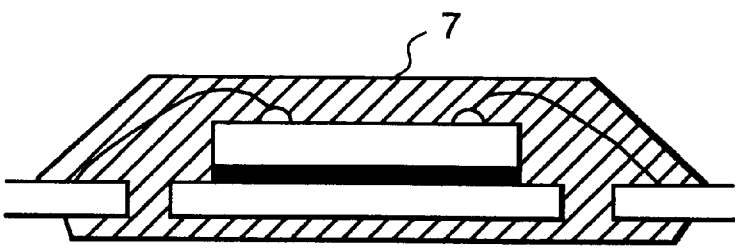
Figure 1:
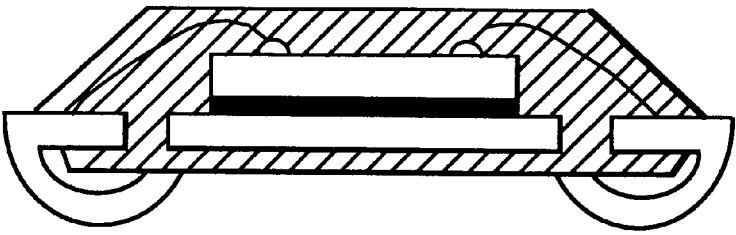

Hereinafter, embodiments of the present invention is explained referring to drawings in detail.

(Embodiments 1~12, and comparative examples 1~7)

The encapsulating materials having mixing ratios indicated in Table 1 were prepared using the following epoxy resin, phenol resin hardeners, organic flame retardants, metal borates, silicone flexibilizer, an inorganic filler prepared by mixing fused silica of cubic or spherical shape having an average particle diameter of 5 μm and fused silica of spherical shape having an average particle diameter of 30 μm in a ratio of 30/70, epoxysilane as a coupling agent, montanic acid ester as a mold release agent, and carbon black as a coloring agent.

In the comparative example 1, brominated epoxy resin was used as a flame retardant, and antimony trioxide was used as a flame resistant assisting agent. All the raw materials were mixed by kneading in a two-axle rolls of 20 inches in diameter at 55~90° C. of the surface temperature of the roll for approximately 10 minutes.

Epoxy resin

| | Epoxy equivalent | softening point (° C.) |
|---|---|---|
| (A) Orthocresol novolak type epoxy resin | 195 | 65 |

(1)

[Structure: Orthocresol novolak type epoxy resin with OCH$_2$CHCH$_2$O, CH$_3$, CH$_2$ groups, repeating n units]

where, n indicates the number of repeating units.

| | Epoxy equivalent | softening point (° C.) |
|---|---|---|
| (B) Biphenyl type epoxy resin | 195 | 107 |

(2)

[Structure: Biphenyl type epoxy resin with CH$_2$CHCH$_2$O— and —OCH$_2$CHCH$_2$O groups and four CH$_3$ substituents]

| | Epoxy equivalent | softening point (° C.) |
|---|---|---|
| (C) Epoxy resin containing dicyclopentadiene skelton | 264 | 62 |

(3)

[Structure: Epoxy resin with dicyclopentadiene skeleton bearing OCH$_2$CHCH$_2$O groups on phenyl rings, repeating H units]

Phenol resin hardeners

| | OH equivalent |
|---|---|
| (A) Phenol novolak resin | 106 |

(4)

[Structure: Phenol novolak resin with OH and CH$_2$ groups, repeating n units]

| | OH equivalent |
|---|---|
| (B) Phenol aralkyl resin | 172 |

(5)

[Structure: Phenol aralkyl resin with OH, CH$_2$-C$_6$H$_4$-CH$_2$ linkages, repeating n units]

| | OH equivalent |
|---|---|
| (C) Phenol resin containing dicyclopentadiene skelton | 161 |

(6)

-continued

[Structure: Phenol resin with dicyclopentadiene skeleton bearing OH groups on phenyl rings, repeating H units]

Organic flame retardants

| | Epoxy equivalent | softening point (° C.) |
|---|---|---|
| (A) Brominated bisphenol A type epoxy resin | 375 | 68 |

(7)

[Structure: Brominated bisphenol A type epoxy resin with Br substituents, CH$_3$ groups, CH$_2$CHCH$_2$O and OCH$_2$CHCH$_2$OH terminal groups, repeating n units]

[Structure: Brominated bisphenol A derivative with four Br substituents, two CH$_3$ groups, and OCH$_2$CHCH$_2$O epoxide group]

(B) Triphenyl phosphine oxide (TPPO)
(C) Phosphoric acid ester (m.p. 95° C.)

| | Epoxy equivalent | softening point (° C.) |
|---|---|---|
| (D) Epoxy resin obtained by a reaction of diphenyl phophinylhydroquinone with epichlorohydrine | 214 | 135 |

(8)

[Structure: Epoxy resin with diphenyl phosphine oxide group P(=O)(C$_6$H$_5$)$_2$ attached to a phenyl ring with two OCH$_2$CHCH$_2$O epoxide groups]

(E) Melamine resin

| | Epoxy equivalent | softening point (° C.) |
|---|---|---|
| (F) Triglycidyl isocyanate | 105 | ~120 |

(9)

[Structure: Triglycidyl isocyanurate - triazine ring with three OCH$_2$CHCH$_2$O epoxide groups]

| | | softening point (° C.) |
|---|---|---|
| (G) 2,2-bis(4-(4-maleimido phenoxy)phenyl)propane | | ~96 |

Silicone flexibilizer
  Side chain modified silicone resin (Molecular weight 73600, epoxy equivalent 3900)
Hardening accelerator DBU; 1,8-biazabicyclo(5,4,0)-undecene
TPP; Triphenyl phosphine
2MZ; 2-methylimidazole

TABLE 1

(Mixing ratios of various molding materials and various physical properties)

| | \[Embodiments\] | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| CM[0] | | | | | | | | | | | | |
| Ep. resin[1] | | | | | | | | | | | | |
| (A) | 85 | 85 | 100 | — | — | 80 | — | 90 | — | 100 | — | 85 |
| (B) | — | — | — | 85 | 100 | — | — | — | 90 | — | 90 | — |
| (c) | — | — | — | — | — | — | 80 | — | — | — | — | — |
| Hardener | | | | | | | | | | | | |
| (A) | 51 | 51 | 54 | — | — | — | 38 | 59 | 54 | 27 | — | 51 |
| (B) | — | — | — | 82 | 91 | — | — | — | — | 44 | 87 | — |
| (c) | — | — | — | — | — | 81 | — | — | — | — | — | — |
| Flame ret.[2] | (A) 15 | (A) 15 | (B) 20 | (A) 15 | (C) 10 | (D) 20 | (A) 20 | (E) 10 (F) 10 | (A) 10 | (C) 10 (E) 10 | (D) 10 | (G) 15 |
| Zn bo.[3] | 50 | 80 | 80 | 55 | 40 | 80 | 80 | 50 | 70 | 40 | 30 | 50 |
| Si fx.[5] | — | 10 | — | — | — | 10 | — | — | 10 | — | — | — |
| Hd. ac.[6] | | | | | | | | | | | | |
| TPP | 3 | 4 | 4 | — | 4 | — | 4 | — | 3.5 | — | 3 | 2.5 |
| BDU | — | — | — | 5 | — | — | — | 3 | — | 4 | — | — |
| 2MZ | — | — | — | — | — | 2.5 | — | — | — | — | — | 0.5 |
| In. Flex.[7] | | | | | | | | | | | | |
| sp/sq[8] | 537 | 628 | 716 | 1049 | — | 703 | 613 | 631 | 727 | 683 | — | 537 |
| co/fi[9] | — | — | — | — | 1400 | — | — | — | — | — | 1450 | — |
| Cpl.[10] | 3 | 3 | 3 | 3 | 3 | 3 | 3 | 3 | 3 | 3 | 3 | 3 |
| Rel.[11] | 1 | 1 | 1 | 1 | 1 | 1 | 1 | 1 | 1 | 1 | 1 | 1 |
| Col.[12] | 1 | 1 | 1 | 1 | 1 | 1 | 1 | 1 | 1 | 1 | 1 | 1 |
| Sb²O₃[13] | — | — | — | — | — | — | — | — | — | — | — | — |
| M[14] | | | | | | | | | | | | |
| Spf.[15] | 30 | 27 | 31 | 35 | 36 | 28 | 30 | 25 | 40 | 29 | 35 | 28 |
| Hard.[16] | 80 | 80 | 81 | 79 | 79 | 80 | 80 | 83 | 80 | 83 | 80 | 79 |
| P[17] | | | | | | | | | | | | |
| Tg[18] | 157 | 155 | 130 | 125 | 124 | 148 | 145 | 158 | 142 | 145 | 128 | 168 |
| Exp.[19] | 1.7 | 1.6 | 1.5 | 1.2 | 1.0 | 1.6 | 1.7 | 1.6 | 1.6 | 1.6 | 0.9 | 1.7 |
| Moi.[20] | 0.48 | 0.50 | 0.41 | 0.35 | 0.29 | 0.49 | 0.48 | 0.51 | 0.46 | 0.46 | 0.30 | 0.49 |
| Adh.[21] | 350 | 395 | 340 | 620 | 530 | 420 | 430 | 390 | 520 | 480 | 500 | 340 |
| Flr.[22] | V-0 | V-0 | V-0 | V-0 | V-0 | V-0 | V-0 | V-0 | V-0 | V-0 | V-0 | V-0 |
| BrPN[23] | | | | | | | | | | | | |
| R[24] | 4.7 | 4.4 | 1.2 | 3.9 | .43 | .73 | 6.8 | 4.5 | 2.9 | 3.8 | .37 | .46 |
| CMB[25] | | | | | | | | | | | | |
| C[26] | 7.0 | 9.1 | 8.2 | 4.2 | 2.4 | 8.2 | 9.5 | 5.8 | 7.2 | 4.3 | 1.8 | 7.0 |
| Extr. Ph[17] | 6.9 | 7.1 | 7.3 | 7.0 | 6.6 | 7.2 | 7.0 | 6.9 | 7.1 | 6.9 | 6.3 | 6.9 |

Remarks:
[0]: composition of materials (parts by weight)
[1]: Epoxy resin
[2]: Flame retardant
[3]: Zinc borate
[5]: Silicone flexibilizer
[6]: Hardening accelerator
[7]: Inorganic filler
[8]: Spherical/cubical (parts)
[9]: Coarse sphere/fine sphere (parts)
[10]: Coupling agent
[11]: Mold releasing agent
[12]: Coloring agent
[13]: Antimony trioxide

TABLE 1-continued (Mixing ratios of various molding materials and various physical properties)

14): Moldability
15): Spiral flow (inches)
16): Hardness at a hot condition (180 ° C./90s)
17): Physical properties of cured body
18): Glass transition temperature (° C.)
19): Linear expansion coefficient ($\times 10^{-5}/°$ C.)
20): Moisture absorption ratio (% by weight)
21): Adhesion (N/m)
22): Flame resistance
23): Element content of Br, P, and N (% by weight)
24): In resin
25): Mixed amount of metal borates (% by weight)
26): In composition
27): pH of extracted liquid

TABLE 2

(Mixing ratios of various molding materials and various physical properties)

| | Comparative example | | | | | | |
|---|---|---|---|---|---|---|---|
| | 1 | 2 | 3 | 4 | 5 | 6 | 7 |
| CM[0] | | | | | | | |
| Ep.resin[1] | | | | | | | |
| (A) | 85 | 85 | 85 | 85 | 99 | 60 | 85 |
| (B) | — | — | — | — | — | — | — |
| (c) | — | — | — | — | — | — | — |
| Hardener | | | | | | | |
| (A) | 51 | 51 | 51 | 51 | 51 | 44 | 51 |
| (B) | — | — | — | — | — | — | — |
| (c) | — | — | — | — | — | — | — |
| Flame ret.[2] | (A) | (A) | (A) | (A) | (A) | (A) | (A) |
| | 15 | 15 | 15 | 15 | 1 | 40 | 15 |
| Bor.A[28] | — | — | — | — | — | — | 5 |
| Zn bo[3] | — | 8 | 170 | 170 | 80 | 40 | — |
| Si fx.[5] | 10 | 10 | 10 | 10 | 10 | 10 | 10 |
| Hd. ac.[6] | | | | | | | |
| TPP | 4 | 4 | 4 | — | 4 | 4 | 4 |
| BDU | — | — | — | — | — | — | — |
| 2MZ | — | — | — | 3 | — | — | — |
| Inor. fil.[7] | | | | | | | |
| sp/sq[8] | 644 | 644 | 644 | 644 | 644 | 644 | 644 |
| co/fi[9] | — | — | — | — | — | — | — |
| Cpl.[10] | 3 | 3 | 3 | 3 | 3 | 3 | 3 |
| Rel.[11] | 1 | 1 | 1 | 1 | 1 | 1 | 1 |
| Col.[12] | 1 | 1 | 1 | 1 | 1 | 1 | 1 |
| $Sb_2O_3$[13] | 15 | — | — | — | — | — | 15 |
| M[14] | | | | | | | |
| Spf.[15] | 29 | 28 | 18 | 23 | 25 | 26 | 28 |
| Hard.[16] | 81 | 80 | 10 | 65 | 79 | 80 | 83 |
| P[17] | | | | | | | |
| Tg[18] | 153 | 153 | 150 | 158 | 155 | 148 | 155 |
| Exp.[19] | 1.6 | 1.6 | 1.6 | 1.7 | 1.6 | 1.7 | 1.6 |
| Moi.[20] | 0.40 | 0.41 | 0.67 | 0.81 | 0.48 | 0.42 | 0.45 |
| Adh.[21] | 380 | 380 | 290 | 280 | 370 | 390 | 350 |
| Flr.[22] | V-0 | V-2 | V-0 | V-0 | V-2 | V-0 | V-0 |
| BrPN[23] | | | | | | | |
| R[24] | 4.4 | 4.4 | 4.4 | 4.4 | .29 | 12.3 | 4.4 |
| CMB[25] | | | | | | | |
| C[26] | — | 1.0 | 17.3 | 17.3 | 8.9 | 4.7 | 0.6 |
| Extr. Ph[27] | 4.0 | 4.8 | 7.6 | 7.6 | 7.1 | 6.6 | 4.2 |

Remarks:
0): composition of materials (parts by weight)
1): Epoxy resin
2): Flame retardant
3): Zinc borate
5): Silicone flexibilizer
6): Hardening accelerator
7): Inorganic filler
8): Spherical/cubical (parts)
9): Coarse sphere/fine sphere (parts)
10): Coupling agent
11): Mold releasing agent
12): Coloring agent
13): Antimony trioxide
28): Boric acid
14): Moldability
15): Spiral flow (inches)
16): Hardness at a hot condition (180 ° C./90s)
17): Physical properties of cured body
18): Glass transition temperature (° C.)
19): Linear expansion coefficient ($\times 10^{-5}/°$ C.)
20): Moisture absorption ratio (% by weight)
21): Adhesion (N/m)
22): Flame resistance
23): Element content of Br, P, and N (% by weight)
24): In resin
25): Mixed amount of metal borates (% by weight)
26): In composition
27): pH of extracted liquid Various characteristics shown in Table 1 and Table 2 were determined as follows:

1. Spiral flow: The measurement was performed in the condition of 180° C. at 70 Kg/cm² using a metallic die in compliance with the EMMI standard.

2. Glass transition temperature and linear expansion coefficient: The measurement was performed with an temperature elevating velocity of 2° C./minute using a thermomechanical analyzer (TMA).

3. Moisture absorption ratio: A disk of 90 mm in diameter, and 2 mm thick was fabricated, and a saturated moisture absorption ratio was determined in the condition of 85° C./85% RH by weight change of the disk.

4. Adhesion: a peel strength between an aluminum foil of 0.03 mm thick and the molding material was determined with a drawing velocity of 50 mm/minute.

5. Flame resistance: The measurement was performed in compliance with the method of UL-94 standard.

6. pH of extracted liquid: The cured epoxy resin composition was pulverized finely with a pulverizing mill, the pulverized powder was immersed into 10 times of pure water in a pressure cooker vessel at 120° C. for 40 hours, and the pH of the extracted liquid was determined in room temperature.

7. Element content of Br, P, and N in the resin: The amount of each of the elements contained in the cured epoxy resin composition was determined by an Inductively coupled plasma (ICP) atomic emission analyzer or an atomic absorption analyzer, and the content of each of the element was obtained by converting the amount of the element to a ratio to the total weight of the resin except zinc borate and the inorganic filler. The total weight of the resin except the zinc borate and the inorganic filler was obtained as a weight of the volatile material by calcining the epoxy resin composition in air at 700° C. for 2 hours, and weighing the calcined residue.

As Table 1 and Table 2 reveal, the resin composition for semiconductor element of the present invention can achieve the level V-0 of the UL standard for flame resistance, as well as the group shown as comparative example No. 1 in Table 2 wherein a brominated organic compound flame retardant and antimony trioxide are concurrently used, by concurrently using at least an organic compound selected from the group consisting of organobromine compounds, organophosphorus compounds, and organonitrogen compounds, and a metallic borate. The resin composition of the present invention has superior characteristics as encapsulating material for the semiconductor elements, because the resin composition is equivalent or superior in moldability and physical properties of the cured body to the conventional resin composition for semiconductor elements shown as the comparative example No. 1 in Table 2. As shown as comparative example No. 2 in Table 2, if the mixed amount of the metallic borate is less than 1.5% by weight to the total weight of the resin, the flame resistance of the resin composition can not achieve the above level V-0 in flame resistance. If the mixed amount of the organic compound flame retardant is less than 0.35% by weight to the total weight of the resin except the inorganic compound (comparative example No. 5), the above level V-0 in flame resistance can not be achieved. On the other hand, as shown in comparative examples No. 3 and No. 4, if the mixed amount of the metallic borate is more than 15% by weight to the total weight of the resin composition, the flame resistance is increased, but the hardness at a hot condition is decreased significantly, and the moldability is also decreased. Furthermore, increase in moisture absorption ratio and decrease in adhesion become significant.

Using the above material, a semiconductor element (outer size 20×14 mm, 2 mm thick), which was formed by mounting a semiconductor element (6×6 mm), whereon a zigzag wiring made of aluminum was formed on its surface, onto a lead frame of 42 alloy group, and wire bonding an aluminum electrode on surface of the semiconductor element to the lead frame with gold wire (30 μm in diameter), was encapsulated, and cured at 175° C. for 5 hours. The reliability test on crack resistance during temperature cycling was performed using the above resin encapsulated semiconductor element by counting the number of packages caused cracks in 1000 cycles as the number of crack generation, wherein one cycle was defined as storing the package at −55° C. for 10 minutes, and subsequently, at 150° C. for 10 minutes. The reliability test on moisture resistance was performed using the above resin encapsulated semiconductor element by counting the number of packages, which caused breakage of wiring by supplying a bias voltage of 20 Volts, as the number of failure after storing the device in a condition of 65° C./95% RH for 1000 hours. The reliability test on reflow soldering resistance was performed using the above resin encapsulated semiconductor element by counting the number of packages, which caused cracks, as the number of crack generation after storing the device in a condition of 85° C./85% RH for 48 hours, and subsequently heating at 240° C. for 10 seconds in a infrared ray reflowing furnace.

The reliability test on storing at a high temperature was performed using the above resin encapsulated semiconductor element by counting the number of failure in connection at the connected portion of the gold wire and the aluminum wiring by determining whether the connected portion was open or not with an applied bias voltage of one volt after storing the semiconductor element at 200° C. for 1000 hours. The results of the above tests are indicated in Table 3 and Table 4. The top number indicates the number of examples and the bottom number indicates the number of failure in Table 3 and Table 4.

TABLE 3

(Results of the reliability tests 1)

| Test item | Embodiments | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Tm[1] | 0/10 | 0/10 | 0/10 | 0/10 | 0/10 | 0/10 | 0/10 | 0/10 | 0/10 | 0/10 | 0/10 | 0/10 |
| Mo[2] | 0/10 | 0/10 | 0/10 | 0/10 | 0/10 | 0/10 | 0/10 | 0/10 | 0/10 | 0/10 | 0/10 | 0/10 |
| Re[3] | 0/10 | 0/10 | 0/10 | 0/10 | 0/10 | 0/10 | 0/10 | 0/10 | 0/10 | 0/10 | 0/10 | 0/10 |
| Hi[4] | 0/10 | 0/10 | 0/10 | 0/10 | 0/10 | 0/10 | 0/10 | 0/10 | 0/10 | 0/10 | 1/10 | 0/10 |

Remarks:
Top number: Number of failure
Bottom number: Number of samples
[1]: Crack resistance during temperature cycling
[2]: Moisture resistance
[3]: Reflow soldering resistance
[4]: Storing at a high temperature

TABLE 4

(Results of the reliability tests 2)

| Test item | Comparative example | | | | | | |
|---|---|---|---|---|---|---|---|
| | 1 | 2 | 3[5] | 4 | 5 | 6 | 7 |
| Tm[1] | 0/10 | 0/10 | — | 0/10 | 0/10 | 0/10 | 0/10 |
| Mo[2] | 3/10 | 2/10 | — | 0/10 | 0/10 | 6/10 | 3/10 |
| Re[3] | 0/10 | 0/10 | — | 8/10 | 0/10 | 2/10 | 1/10 |
| Hi[4] | 10/10 | 8/10 | — | 2/10 | 0/10 | 10/10 | 10/10 |

Remarks:
Top number: Number of failure
Bottom number: Number of samples
[1]: Crack resistance during temperature cycling
[2]: Moisture resistance
[3]: Reflow soldering resistance
[4]: Storing at a high temperature
[5]: Semiconductor element could not be manufactured Table 3 and Table 4 indicate that the semiconductor elements of the present invention have the superior reliability. The reason is that the resin composition of the present invention has desirable values designated by the present invention in physical properties, which effect to the reliability, such as the linear expansion coefficient, glass transition temperature, saturated moisture absorption ratio, adhesion, and pH of the extracted liquid as indicated in Table 1. Particularly, the semiconductor element of the present invention, wherein the semiconductor element is encapsulated with the resin composition including a metal borate, has significantly superior reliability in comparison with the conventional semiconductor element (comparative example No. 1), even with a high temperature low supplied voltage such as 200° C./1 V. The semiconductor element could not be manufactured with the reference sample No. 3, because curability of the resin composition was extremely unsuitable. The comparative example No. 6 contained the metal borate in its resin composition. However, because the content of at least one element of bromine, phosphorus, and nitrogen contained in at least an organic compound selected from the group consisting of one of organobromine compounds, organophosphorus compounds, and organonitrogen compounds is more than 10% by weight to the total weight of resin except the inorganic filler, an effect of released bromine compound is remarkable, and decrease in reliability on storing at a high temperature can be observed. When boric acid was used as the boron compound, improvement in the reliability of the semiconductor element was scarcely observed (ref. to comparative example No. 7).

In accordance with the embodiments shown in Table 1 and Table 3, the examples using zinc borate which is a typical example of the metal borates are shown. However, the cured bodies of epoxy resin compositions containing other metal borates such as aluminum borate, borax, and others, have almost the same flame resistance and characteristics as that of the cured body of the resin composition containing zinc borate. Furthermore, the semiconductor element encapsulated with the epoxy resin compositions containing other metal borates such as aluminum borate, borax, and others, have almost the same reliability as the resin composition containing zinc borate.

(Embodiment 13)

Figure 2:
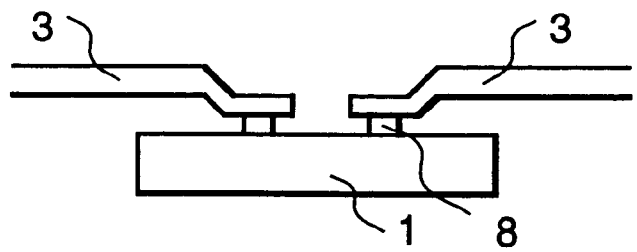
FIGS. 2(a)~2(d) are schematic cross sections indicating the process for manufacturing the resin encapsulated semiconductor element of lead-on chip mode of the present invention.
Figure 2:
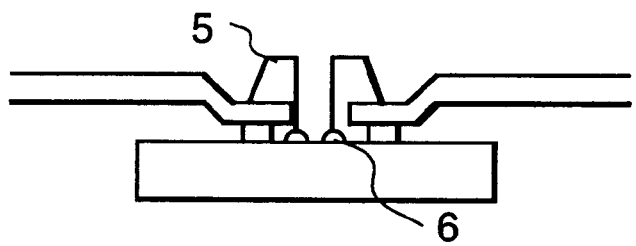
Figure 2:
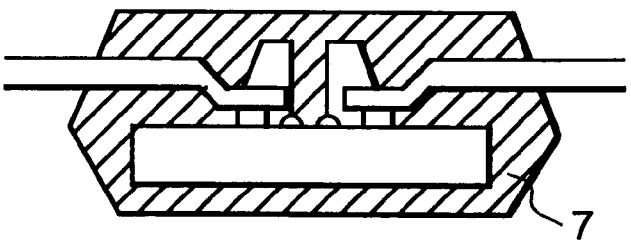
Figure 2:
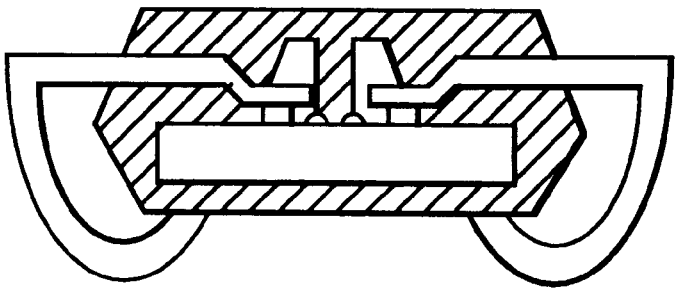
Figure 3:
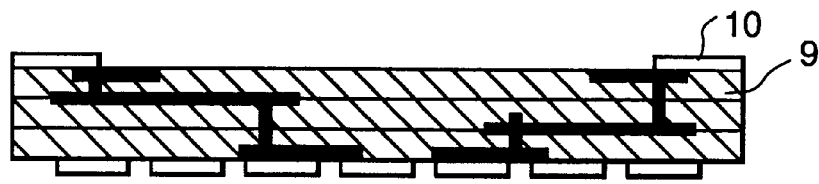
FIGS. 3(a)~3(e) are schematic cross sections indicating the process for manufacturing the resin encapsulated semiconductor element of ball grid array of the present invention.
Figure 3:
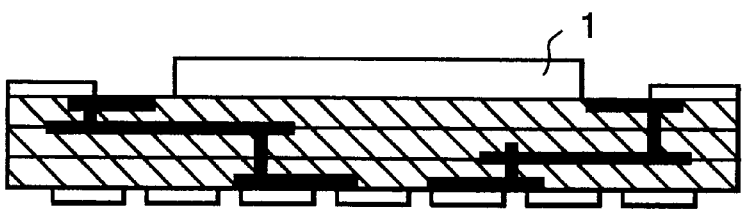
Figure 3:
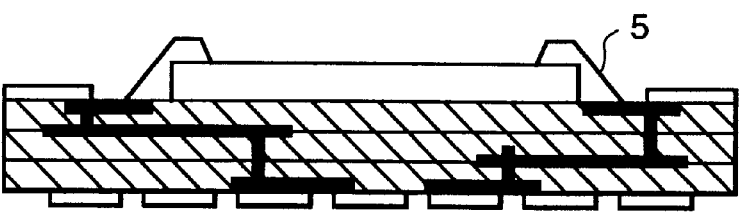
Figure 3:
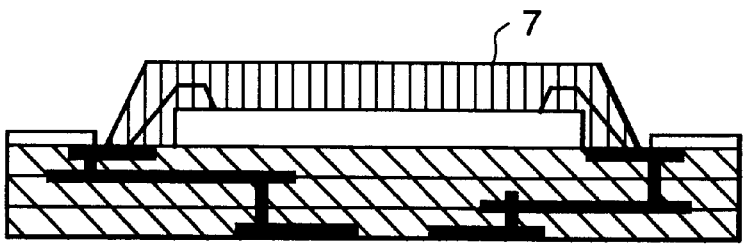
Figure 3:
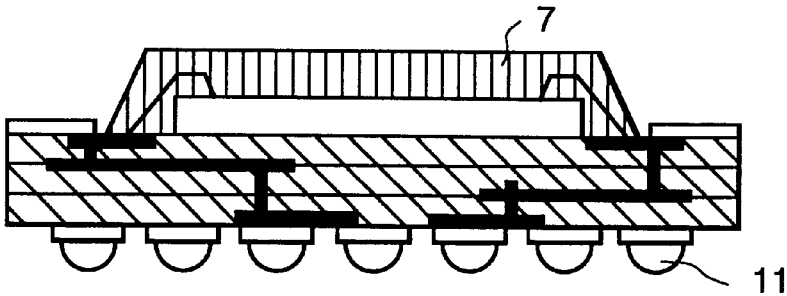
Figure 4:
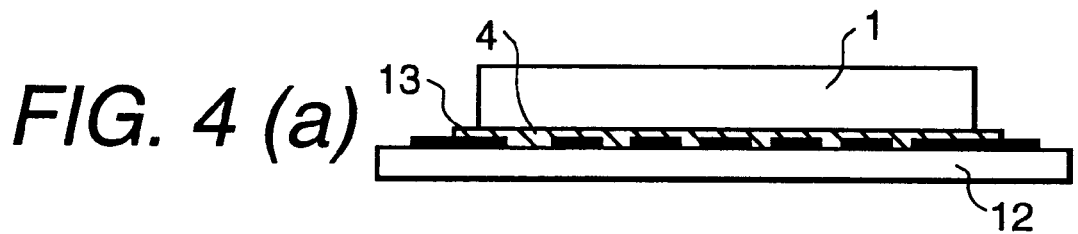
FIGS. 4(a)~4(d) are schematic cross sections indicating the process for manufacturing the resin encapsulated semiconductor element of chip size of the present invention.
Figure 4:
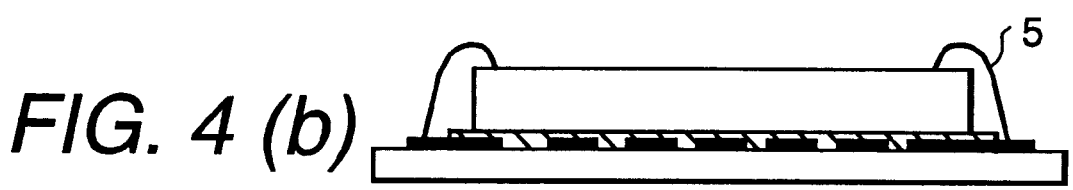
Figure 4:
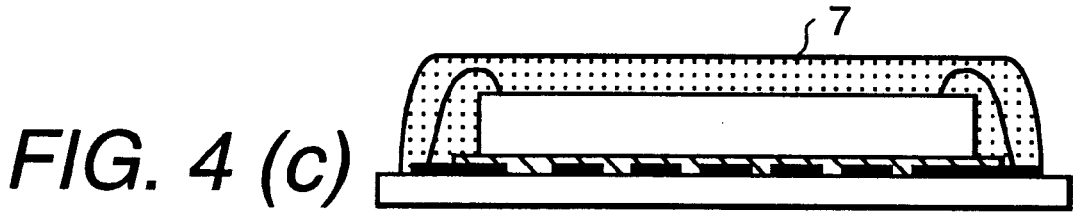
Figure 4:
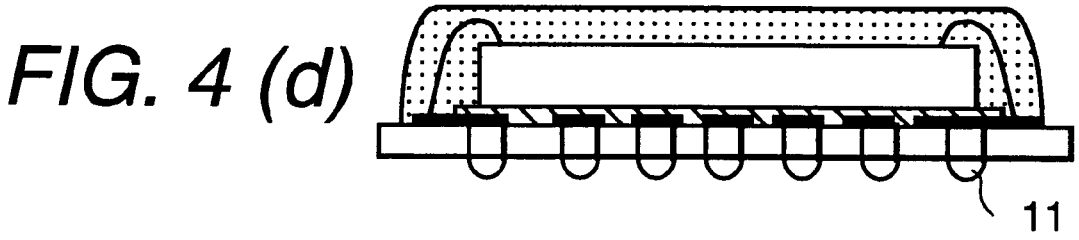

Using the resin composition of the embodiment No. 2 indicated in Table 1, a semiconductor element (outer size 20×14 mm, 2 mm thick) was formed by mounting a semiconductor element (6×6 mm), whereon a zigzag wiring made of aluminum was formed on its surface as indicated in FIG. 2, onto a lead frame of 42 alloy group made of laminated polyimide films, of which both planes were applied with an adhesive agent, by adhering with the adhesive agent by heating and melting, and wire bonding an aluminum electrode on surface of the semiconductor element to the lead frame with gold wire (30 μm in diameter), was encapsulated, and cured at 175° C. for 5 hours. Various reliability tests such as crack resistance during temperature cycling, moisture resistance, reflow soldering resistance, and storing at a high temperature were performed on the resin encapsulated semiconductor element obtained by the above procedure with the same condition as indicated in Table 3. The results of the reliability tests revealed that the semiconductor element had superior reliability, because no cracks of the package nor failure of the connection were observed.

The semiconductor element obtained by the present invention has the same flame resistance as the conventional semiconductor element encapsulated with the resin composition containing halogen and antimony compounds, and reliabilities on moisture resistance and storing at a high temperature are improved remarkably by effects of the contained metal borate for suppressing generation or trapping released gas components such as halogen, phosphorus, and the like.

Furthermore, because fluidity, curability, and physical properties of the cured body of the resin composition of the present invention are designated as approximately same as the conventional semiconductor material, moldability does not have any problem. Preferable characteristics in other various reliability such as on crack resistance during temperature cycling, reflow soldering resistance, and others, are obtained. Therefore, industrial value of the resin encapsulated semiconductor element of the present invention is remarkable.

What is claimed is:

1. A resin encapsulated semiconductor element comprising a semiconductor element encapsulated with a resin composition, wherein
   said resin composition is an epoxy resin composition containing:
   (i) an inorganic filler,
   (ii) an organic compound selected from the group consisting of organobromine compounds, organophosphorus compounds and organonitrogen compounds, and
   (iii) a metal borate.

2. A resin encapsulated semiconductor element claimed in claim 1, wherein
   the content of an element selected from the group consisting of bromine, phosphorus and nitrogen in said organic compounds is in the range of 0.35~10% by weight to the total weight of said resin composition, except for said metal borate and said inorganic filler.

3. A resin encapsulated semiconductor element claimed comprising a semiconductor element encapsulated with resin composition, wherein
   said resin composition is an epoxy resin composition containing:
   (i) an organic compound selected from the group consisting of organobromine compounds, organophosphorus compounds, and organonitrogen compounds, and
   (ii) a metal borate,
       wherein liquid of said epoxy resin composition extracted with hot water of ten times the volume of said composition at 120° C. for 40 hours has a pH in the range of 5.0~7.5.

4. A resin encapsulated semiconductor element comprising a semiconductor element encapsulated with an epoxy resin composition containing at least an organic compound selected from the group consisting of organobromine compounds, organophosphorus compounds and organonitrogen compound, and a metal borate, wherein a failure, generated by an electrical open circuit condition at an external terminal caused by storing said semiconductor element in a thermostatic chamber at 200° C. for 1000 hours with application of a voltage of one volt, is less than 0.1%.

5. A resin encapsulated semiconductor element as claimed in any one of claims 1~4, wherein
said organophosphorus compounds are a compound having the structure expressed by the following formula (1) and an aromatic ring:

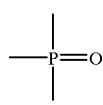

(1)

and,
said organonitrogen compounds are a compound having an aromatic ring or a heterocyclic ring.

6. A resin encapsulated semiconductor element claimed in claim 1, wherein said organic compound is an organobromine compound.

7. A resin encapsulated semiconductor element claimed in claim 1, wherein said organic compound is an organophosphorus compound.

8. A resin encapsulated semiconductor element is claimed in claim 1, wherein said organic compound is an organonitrogen compound.

9. A resin encapsulated semiconductor element claimed in claim 1, wherein the metal borate is in particulate form, and has an average particle diameter of 20 $\mu$m and a maximum particle diameter of 100 $\mu$m.

10. A resin encapsulated semiconductor element comprising a semiconductor element encapsulated with resin composition, wherein
said resin composition is an epoxy resin composition containing
an organic compound selected from the group consisting of organobromine compounds, organophosphorus compounds, and organonitrogen compounds, and
a metal borate,
wherein a thermoset composition has characteristics of:
a linear expansion coefficient in the range of 0.6~2.5×10$^{-5}$,
a glass transition temperature of at least 110° C., a saturated moisture absorption ratio of utmost 0.8% by weight under the condition of 85° C. 85% RH, and
a flame resistance of the level V-0 in the UL-94 standard.

11. A resin encapsulated semiconductor element comprising a semiconductor element encapsulated with resin composition, wherein
said resin composition is an epoxy resin composition containing:
(i) an inorganic filler,
(ii) an organic compound selected from the group consisting of organobromine compounds, organophosphorus compounds, and organonitrogen compounds, and
(iii) a metal borate,
wherein the content of an element selected from the group consisting of bromine, phosphorus, and nitrogen of said organic compounds is in the range of 0.35~10% by weight to the total weight of said resin composition, except for said metal borate and said inorganic filler, and
said metal borate is contained in the range of 1.5~15% by weight to the total weight of said resin composition.

12. A resin encapsulated semiconductor element comprising a semiconductor element encapsulated with resin composition, wherein
said resin composition is an epoxy resin composition containing:
(i) an organic compound selected from the group consisting of organobromine compounds, organophosphorus compounds, and organonitrogen compounds,
(ii) an inorganic filler, and
(iii) a metal borate,
wherein the content of an element selected from the group consisting of bromine, phosphorus, and nitrogen of said organic compounds is in the range of 0.4~7% by weight to the total weight of said resin composition, except for said metal borate and said inorganic filler, and
said metal borate is contained in the range of 1.5~15% by weight to the total weight of said resin composition.

13. A resin encapsulated semiconductor element comprising a semiconductor element encapsulated with resin composition, wherein
said semiconductor element is mounted on a lead frame and is connected to the lead frame with gold wire, and
said semiconductor element is encapsulated by integrated resin molding with the resin composition, which is an epoxy resin composition containing:
(i) an organic compound selected from the group consisting of organobromine compounds, organophosphorus compounds and organonitrogen compounds,
(ii) an inorganic filler, and
(iii) a metal borate, wherein
a thermally cured body of said epoxy resin composition has characteristics of:
a linear expansion coefficient in the range of 0.6–2.5×10$^{-5}$,
a glass transition temperature of at least 110° C.,
a saturated moisture absorption ratio of, utmost, 0.8% by weight in the condition of 85° C. 85% RH, and
a flame resistance of the level V-0 in the UL-94 standard.

14. A lead-on-chip type semiconductor element comprising a semiconductor element encapsulated with resin composition, wherein
a lead frame is mounted on said semiconductor element by adhering with an organic film adhesive agent of an inorganic connecting material,
an electrode on said semiconductor element is connected to the lead frame with gold wire, and,
said semiconductor element is encapsulated by integrated resin molding with the resin composition, which is an epoxy resin composition containing
(i) an organic compound selected from the group consisting of organobromine compounds, organophosphorus compounds and organonitrogen compounds,
(ii) an inorganic filler, and
(iii) a metal borate, wherein
a thermoset composition has characteristics of:
a linear expansion coefficient in the range of 0.6~2.5×10$^{-5}$,
a glass transition temperature of at least 110° C., a saturated moisture absorption ratio of, utmost, 0.8% by weight in the condition of 85° C. 85% RH, and a flame resistance of the level V-0 in the UL-94 standard.

15. A ball grid array or a pin grid array resin encapsulated semiconductor element comprising:

a semiconductor element mounted on a top surface of a resin substrate having a circuit pattern, and an external connecting terminal provided at a bottom surface of the resin substrate, wherein said semiconductor element is encapsulated by integrated resin molding with a resin composition containing:
(i) an organic compound selected from the group consisting of organobromine compounds, organophosphorus compounds and organonitrogen compounds,
(ii) an inorganic filler, and
(iii) a metal borate, wherein
a thermoset composition has characteristics of:
a linear expansion coefficient in the range of $0.6$–$2.5 \times 10^{-5}$,
a glass transition temperature of at least 110° C., 0.8% by weight in the condition of 85° C. 85% RH, and
a flame resistance of the level V-0 in the UL-94 standard.

16. A ball grid array or a chip size resin encapsulated semiconductor element comprising:

a semiconductor element mounted on a top surface of a circuit film having a circuit pattern, and an external connecting terminal provided at a bottom surface of the resin substrate, wherein said semiconductor element is encapsulated by integrated resin molding with a resin composition containing:
(i) an organic compound selected from the group consisting of organobromine compounds, organophosphorus compounds and organonitrogen compounds,
(ii) an inorganic filler, and
(iii) a metal borate, wherein
a thermoset composition has characteristics of:
a linear expansion coefficient in the range of $0.6$–$2.5 \times 10^{-5}$,
a glass transition temperature of at least 110° C.,
a saturated moisture absorption ratio of, at the utmost, 0.8% by weight in the condition of 85° C. 85% RH, and
a flame resistance of the level V-0 in the UL-94 standard.

* * * * *